(12) United States Patent
Xiong

(10) Patent No.: US 9,766,509 B2
(45) Date of Patent: Sep. 19, 2017

(54) PIXEL UNIT

(71) Applicant: SHENZHEN CHINA STAR OPTOELECTRONICS TECHNOLOGY CO., LTD., Shenzhen, Guangdong (CN)

(72) Inventor: Yuan Xiong, Shenzhen (CN)

(73) Assignee: SHENZHEN CHINA STAR OPTOELECTRONICS TECHNOLOGY CO., LTD., Shenzen (CN)

( * ) Notice: Subject to any disclaimer, the term of this patent is extended or adjusted under 35 U.S.C. 154(b) by 98 days.

(21) Appl. No.: 14/783,659

(22) PCT Filed: Aug. 7, 2015

(86) PCT No.: PCT/CN2015/086377
§ 371 (c)(1),
(2) Date: Oct. 9, 2015

(87) PCT Pub. No.: WO2017/015986
PCT Pub. Date: Feb. 2, 2017

(65) Prior Publication Data
US 2017/0160596 A1    Jun. 8, 2017

(30) Foreign Application Priority Data
Jul. 28, 2015    (CN) .......................... 2015 1 0451741

(51) Int. Cl.
H01L 21/14    (2006.01)
G02F 1/1343    (2006.01)
G09G 3/36    (2006.01)
G02F 1/1368    (2006.01)
H01L 27/12    (2006.01)

(52) U.S. Cl.
CPC ...... *G02F 1/134309* (2013.01); *G02F 1/1368* (2013.01); *G09G 3/3677* (2013.01); *G09G 3/3688* (2013.01); *H01L 27/124* (2013.01); *G02F 2201/123* (2013.01)

(58) Field of Classification Search
USPC ........................................................... 257/72
See application file for complete search history.

(56) References Cited

U.S. PATENT DOCUMENTS

| 9,268,190 | B1* | 2/2016 | Lin | G02F 1/1368 |
| 2010/0019998 | A1* | 1/2010 | You | G02F 1/133707 345/87 |
| 2012/0307190 | A1* | 12/2012 | Zhang | G02F 1/133707 349/142 |
| 2013/0229608 | A1* | 9/2013 | Lee | G02F 1/134309 349/138 |

* cited by examiner

Primary Examiner — Timor Karimy
(74) Attorney, Agent, or Firm — Sughrue Mion, PLLC

(57) ABSTRACT

A pixel unit is provided. The pixel unit includes a first strip main electrode extending to a first edge of the pixel unit. A first strip edge electrode of the first strip main electrode extends perpendicularly to the first edge. The present invention improves light leakage or dark lines occurring in the edge region of the pixel unit due to misalignment between an upper substrate and a lower substrate which are assembled.

20 Claims, 4 Drawing Sheets

PIXEL UNIT

FIELD OF THE INVENTION

The present invention relates to the field of display technologies, and more particularly to a pixel unit.

BACKGROUND OF THE INVENTION

In the design of conventional pixel electrodes, an opening design for being disposed in an edge region of the pixel electrode is often adapted for facilitating the arrangement of liquid crystals in a light-transmission region. However, in the situation of adapting the opening design for the edge region of the pixel electrode, if misalignment occurs between the upper and lower substrates (e.g. an array substrate and a color filter substrate) after the upper and lower substrates have been assembled, it leads to occurrence of light leakage or dark lines in the edge region of the pixel unit. Namely, light leakage or dark lines occurs in the edge region of the pixel unit, thereby affecting the dark state luminance or transmittance.

Refer to FIG. 1, which is an opening design for the conventional pixel electrode. The pixel unit is formed by intersecting scanning lines 12 and data lines 11. The pixel electrode of the pixel unit includes a plurality of strip pixel electrodes 101 which extend to an edge of the pixel unit. In practical application, since the design lacks control of the liquid crystals in the edge region, light leakage or dark lines will occur in the edge region of the pixel unit.

Therefore, it is necessary to provide a pixel unit to solve the above problems existing in the prior art.

SUMMARY OF THE INVENTION

An object of the present invention is to provide a pixel unit which can solve a technical problem of light leakage or dark lines with occur in the edge region of the conventional pixel unit.

In order to solve the aforementioned drawbacks of the prior art, the present invention provides the following technical solutions.

The present invention provides a pixel unit for displaying a scene, comprising:

a thin film transistor configured for receiving a scanning signal and a data signal, and for controlling whether to transmit the data signal to a pixel electrode through a drain according to the scanning signal; and the pixel electrode electrically connected to the drain of the thin film transistor;

the pixel electrode comprises:

a plurality of first strip electrodes extending to a first edge of the pixel unit;

a second strip electrode extending to a second edge of the pixel unit;

a third strip electrode extending to a third edge of the pixel unit;

a fourth strip electrode extending to a fourth edge of the pixel unit;

each of the first strip electrodes comprises:

a first strip main electrode, which extends to the first edge; and a first strip edge electrode, which extends perpendicularly to the first edge, an extension initial end of the first strip edge electrode being connected with an extension terminal end of the first strip edge electrode;

the second strip electrode comprises:

a second strip main electrode, which extends to the second edge;

a second strip edge electrode, which extends perpendicularly to the second edge, an extension initial end of the second strip edge electrode being connected with an extension terminal end of the second strip edge electrode;

the first strip main electrodes comprise a first type and a second type;

wherein the first strip main electrodes of the first type are mutually parallel, and the first strip main electrodes of the second type are mutually parallel.

In the pixel unit described above, the third strip electrode comprises:

a third strip main electrode, which extends to the third edge; and a third strip edge electrode, which extends perpendicularly to the third edge, an extension initial end of the third strip edge electrode being connected with an extension terminal end of the third strip edge electrode.

In the pixel unit described above, the fourth strip electrode comprises:

a fourth strip main electrode which extends to the fourth edge; and a fourth strip edge electrode, which extends perpendicularly to the fourth edge, an extension initial end of the fourth strip edge electrode being connected with an extension terminal end of the fourth strip edge electrode.

In the pixel unit described above, the pixel electrode comprises a plurality of second strip electrodes;

the second strip main electrodes comprise a third type and a fourth type;

the second strip main electrodes of the third type are mutually parallel;

the second strip main electrodes of the fourth type are mutually parallel.

In the pixel unit described above, the first strip main electrode of the first type and the second strip main electrode of the third type are mutually parallel.

In the pixel unit described above, the fourth strip electrode comprises:

a fourth strip main electrode, which extends to the fourth edge; and a fourth strip edge electrode which extends perpendicularly to the fourth edge, an extension initial end of the fourth strip edge electrode being connected with an extension terminal end of the fourth strip edge electrode.

In the pixel unit described above, the pixel electrode comprises a plurality of second strip electrodes;

the second strip main electrodes comprise a third type and a fourth type;

the second strip main electrodes of the third type are mutually parallel;

the second strip main electrodes of the fourth type are mutually parallel.

In the pixel unit described above, the first strip main electrode of the first type and the second strip main electrode of the third type are mutually parallel.

In the pixel unit described above, an angle between the first strip main electrode and the first strip edge electrode is between 90 degrees and 140 degrees.

In the pixel unit described above, an angle between the second strip main electrode and the second strip edge electrode is between 90 degrees and 140 degrees.

In another embodiment of the present invention further provides a pixel unit for displaying a scene, comprising:

a thin film transistor configured for receiving a scanning signal and a data signal, and for controlling whether to transmit the data signal to a pixel electrode through a drain according to the scanning signal; and the pixel electrode electrically connected to the drain of the thin film transistor;

the pixel electrode comprising:

a plurality of first strip electrodes extending to a first edge of the pixel unit;

a second strip electrode extending to a second edge of the pixel unit;

a third strip electrode extending to a third edge of the pixel unit;

a fourth strip electrode extending to a fourth edge of the pixel unit;

each of the first strip electrodes comprising:

a first strip main electrode, which extends to the first edge; and a first strip edge electrode, which extends perpendicularly to the first edge, an extension initial end of the first strip edge electrode being connected with an extension terminal end of the first strip edge electrode.

In the pixel unit described above, the second strip electrode comprises:

a second strip main electrode, which extends to the second edge;

a second strip edge electrode which extends perpendicularly to the second edge, an extension initial end of the second strip edge electrode being connected with an extension terminal end of the second strip edge electrode.

In the pixel unit described above, the third strip electrode comprises:

a third strip main electrode, which extends to the third edge; and a third strip edge electrode, which extends perpendicularly to the third edge, an extension initial end of the third strip edge electrode being connected with an extension terminal end of the third strip edge electrode.

In the pixel unit described above, the fourth strip electrode comprises:

a fourth strip main electrode, which extends to the fourth edge; and a fourth strip edge electrode, which extends perpendicularly to the fourth edge, an extension initial end of the fourth strip edge electrode being connected with an extension terminal end of the fourth strip edge electrode.

In the pixel unit described above, the pixel electrode comprises a plurality of first strip electrodes;

the first strip main electrodes comprise a first type and a second type;

the first strip main electrodes of the first type are mutually parallel, and the first strip main electrodes of the second type are mutually parallel.

In the pixel unit described above, the pixel electrode comprises a plurality of second strip electrodes;

the second strip main electrodes comprise a third type and a fourth type;

the second strip main electrodes of the third type are mutually parallel;

the second strip main electrodes of the fourth type are mutually parallel.

In the pixel unit described above, the first strip main electrodes comprise a first type and a second type;

the first strip main electrodes of the first type are mutually parallel;

the first strip main electrodes of the second type are mutually parallel.

In the pixel unit described above, the first strip main electrode of the first type and the second strip main electrode of the third type are mutually parallel.

In the pixel unit described above, an angle between the first strip main electrode and the first strip edge electrode is between 90 degrees and 140 degrees.

In the pixel unit described above, an angle between the first strip main electrode and the first strip edge electrode is between 90 degrees and 140 degrees.

The present invention provides a pixel unit comprising: a thin film transistor configured for receiving a scanning signal and a data signal, and for controlling whether to transmit the data signal to a pixel electrode through a drain according to the scanning signal, and the pixel electrode is electrically connected to the drain of the thin film transistor. The pixel electrode comprises: a plurality of first strip electrodes extending to a first edge of the pixel unit, a second strip electrode extending to a second edge of the pixel unit, a third strip electrode extending to a third edge of the pixel unit, and a fourth strip electrode extending to a fourth edge of the pixel unit. Each of the first strip electrodes comprises: a first strip main electrode, which extends to the first edge; and a first strip edge electrode, which extends perpendicularly to the first edge, an extension initial end of the first strip edge electrode being connected with an extension terminal end of the first strip edge electrode. Thus, the strip edge electrode extending perpendicularly to the edge is additionally disposed in the edge region of the pixel unit of the present invention, so that liquid crystals in the edge region of the pixel unit are aligned explicitly (a long axis of the liquid crystal is parallel to the strip edge electrode). Therefore, the pixel unit of the present invention can better control the arrangement of the liquid crystal in the edge region, which can improve dark lines occurring in the edge region of the pixel unit due to misalignment between the upper substrate and lower substrate which are assembled. Simultaneously, the pixel unit of the present invention can form a stable dark area in the edge region for preventing light leakage from occurring in the edge region of the pixel unit due to misalignment between the upper substrate and lower substrate which are assembled. Furthermore, the pixel unit of the present invention can increase the transmittance and contrast.

DETAILED DESCRIPTION OF THE PREFERRED EMBODIMENTS

Figure 1:
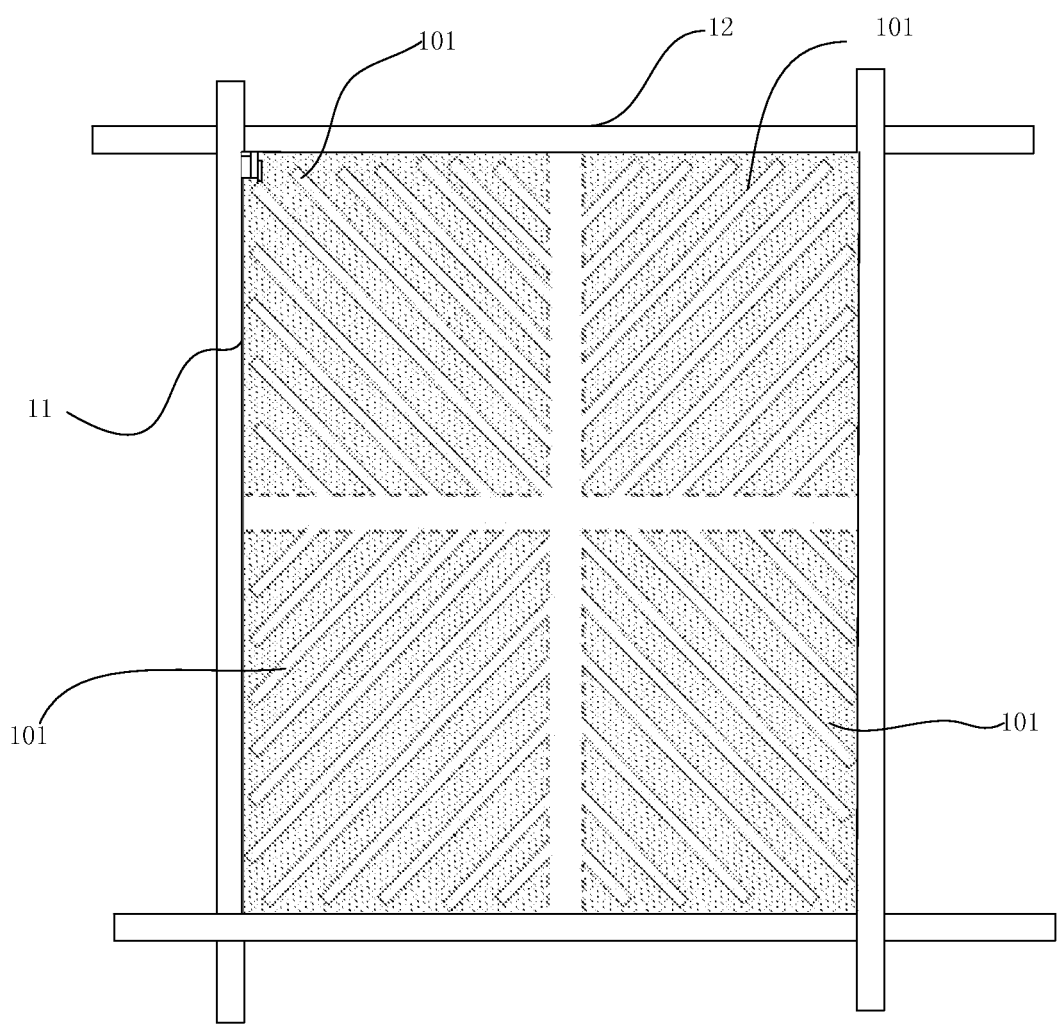
FIG. 1 is a schematic view of a conventional pixel electrode with an opening design.

This description of the exemplary embodiments is intended to be read in connection with the accompanying drawings, which are to be considered part of the entire written description. In the description, terms such as "lower", "upper", "horizontal", "vertical", "above", "below", "up", "down", "top", and "bottom", as well as derivatives thereof should be construed to refer to the orientation as then described or as shown in the drawing under discussion. These terms are for convenience of description and do not require that the apparatus be constructed or operated in a particular orientation, and do not limit the scope of the invention. Referring now in more detail to the drawings in which like numerals indicate corresponding parts throughout the drawings.

Figure 2:
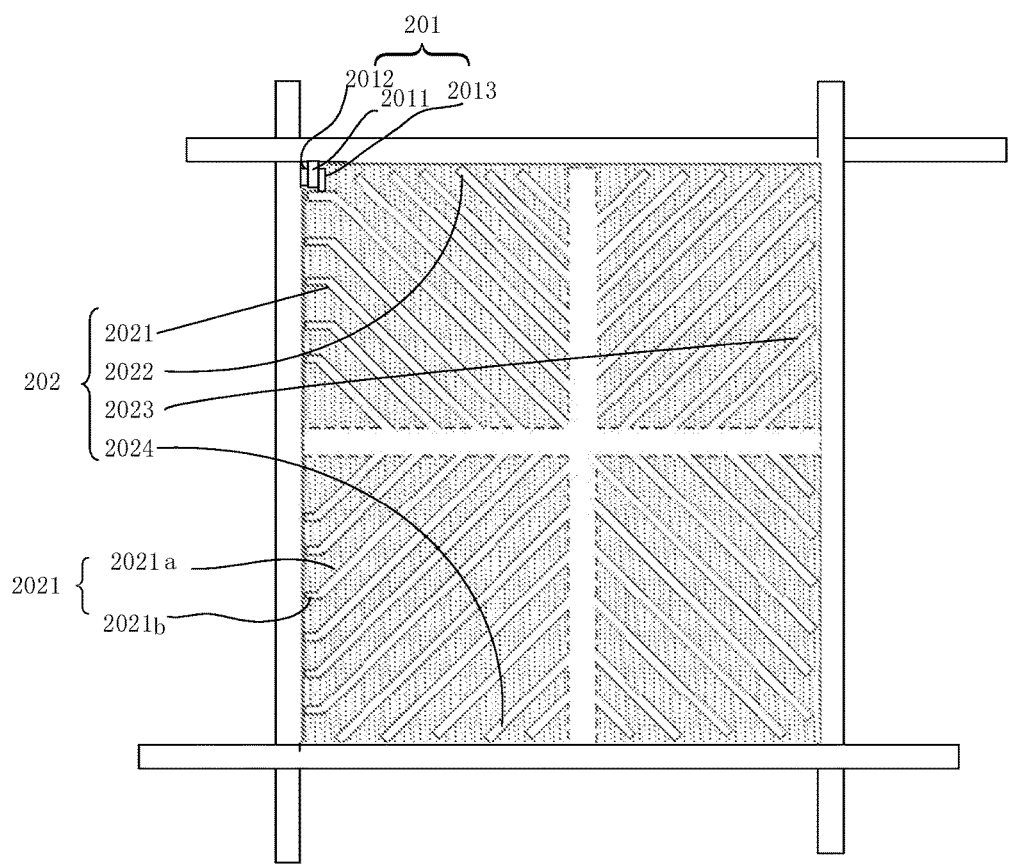
FIG. 2 is a structural schematic view of a pixel unit according to an embodiment of the present invention.
Figure 3:
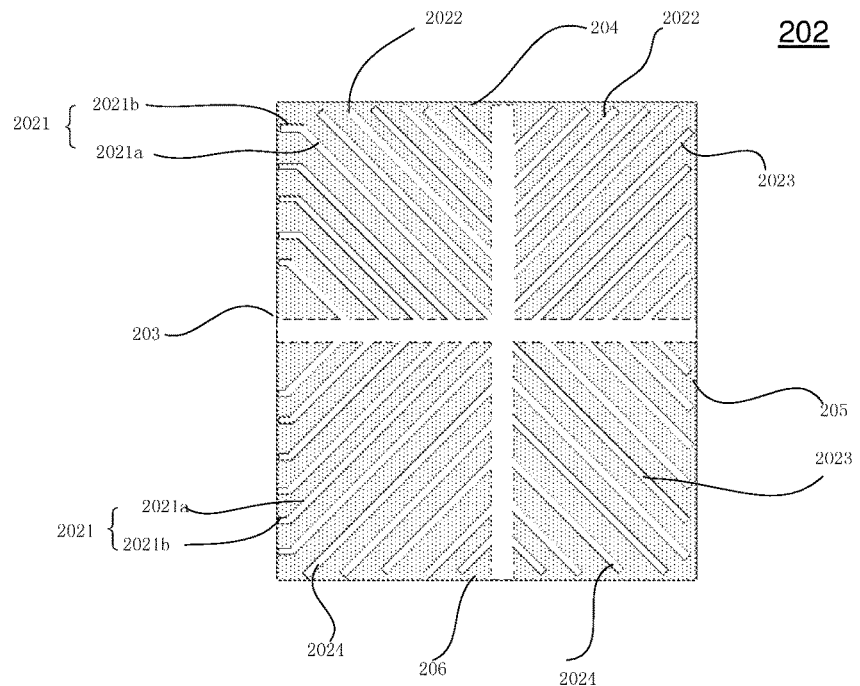
FIG. 3 is a schematic view of a first type of the pixel unit according to the embodiment of the present invention.

Refer to FIGS. 2-3, the present invention provides a pixel unit as follows.

The pixel unit in the preferred embodiment of the present invention is composed by the intersections of a first scanning line 204, a second scanning line 206, a first data line 204, and a second data line 206. The first scanning line 204 and the second scanning line 206 are configured for transmitting a scanning signal, respectively. The first data line 203 and the second data line 205 are configured for transmitting a data signal, respectively. The pixel unit is configured for displaying a scene according to the scanning signal and the data signal. The pixel unit comprises a thin film transistor 201 configured for receiving the scanning signal and the data signal, and for controlling whether the data signal is transmitted to a pixel electrode 202 through a drain 2013 according to the scanning signal.

Specifically, a gate 2011 of the thin film transistor 201 receives the scanning signal of the first scanning line 204, and a source 2012 receives the data signal transmitted by the first data line 203. The pixel electrode 202 is electrically connected to the drain 2013 of the thin film transistor 201.

Figure 4:
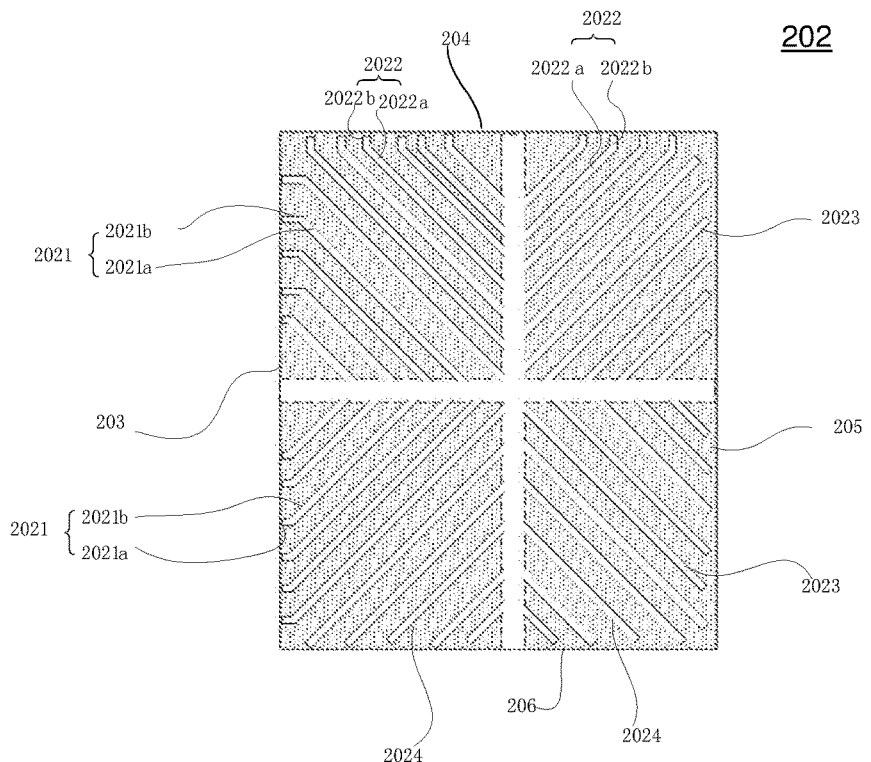
FIG. 4 is a schematic view of a second type of the pixel unit according to the embodiment of the present invention.
Figure 5:
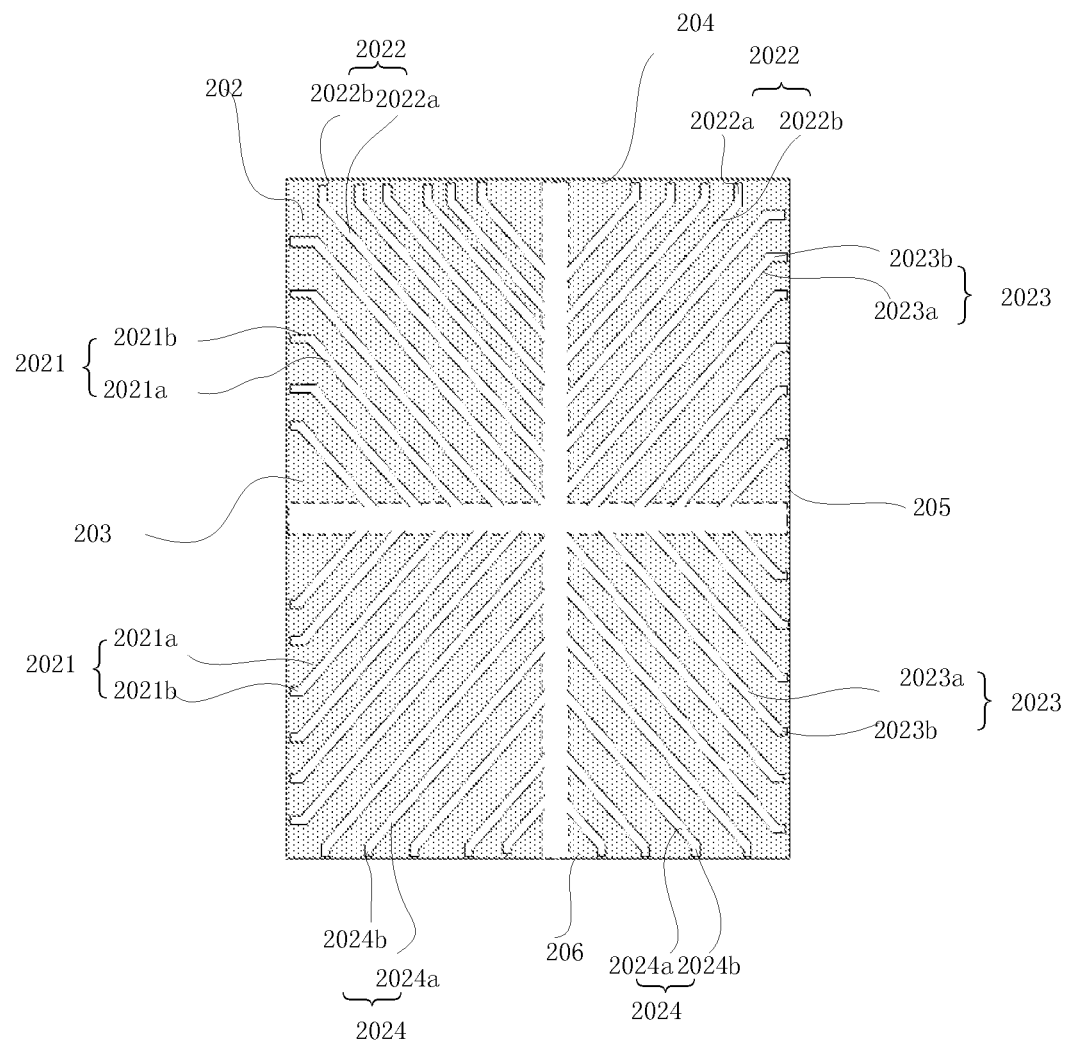
FIG. 5 is a schematic view of a third type of the pixel unit according to the embodiment of the present invention.

To facilitate description the structure of the pixel electrode in the embodiment of the present embodiment, the description of the pixel electrode is simplified in the embodiment. Specifically, the thin film transistor 201 is ignored, and the scanning line and the data line are substituted by edges. Refer to FIG. 3. A first edge of the pixel unit is the first data line 203, a second edge of the pixel unit is the first scanning line 204, a third edge of the pixel unit is the second data line 205, and a fourth edge of the pixel unit is the second scanning line 206. The pixel unit in the following FIGS. 4-5 are simplified, and described similarly to FIG. 3.

As shown in FIG. 3, the pixel electrode 202 comprises a first strip electrode 2021 extending to the first edge 203 of the pixel unit, a second strip electrode 2022 extending to the second edge 204 of the pixel unit, a third strip electrode 2023 extending to the third edge 205 of the pixel unit, and a fourth strip electrode 2024 extending to the fourth edge 206 of the pixel unit.

The first strip electrode 2021 comprises a first strip main electrode 2021a extending to the first edge 203 and a first strip edge electrode 2021b which extends perpendicularly to the first edge 203. Namely, an angle between the first strip main electrode 2021a and the first strip edge electrode 2021b is 90 degrees.

An extension initial end of the first strip edge electrode 2021a is connected with an extension terminal end of the first strip edge electrode 2021b.

Preferably, in the preferred embodiment of the present invention, the first strip main electrodes 2021a comprise a first type and a second type. The types of the strip main electrodes can be differentiated on the basis of different targets which the strip main electrodes extend to in the preferred embodiment.

For example, the first strip main electrodes 2021a of the first type are the first strip main electrodes 2021a extending to a front section of the first edge, and the first strip main electrodes 2021a of the second type are the first strip electrodes 2021 extending to a rear section of the first edge.

In the preferred embodiment of the present invention, the division of the front section and the rear section can be divided according to the midpoint of the first edge.

In the preferred embodiment of the present invention, in order to dispose the first strip electrode in a limited space as much as possible, the first strip main electrodes 2021a of the first type are mutually parallel, and the first strip main electrodes 2021a of the second type are mutually parallel. Preferably, an angle between the first strip main electrode 2021a and the first strip edge electrode 2021b is between 90 degrees and 140 degrees so as to improve the display effect of the pixel unit.

Preferably, the first strip main electrode 2021a and the first strip edge electrode 2021b can be formed integrally in the preferred embodiment.

As shown in FIG. 3, the pixel unit is a rectangular pixel unit. The first edge 203, the second edge 204, the third edge 205, and the fourth edge 206, which are the first data line, the first scanning line, the second data line and the second scanning line, are respectively four sides of the rectangular pixel unit. Each edge of the pixel unit corresponds to one type of strip electrode extending to the edge, such as the first edge 203 corresponds to the first strip electrode 2021 which extends to the first edge 203.

The first edge 203 is an edge located in a horizontal direction of the rectangular pixel unit in the preferred embodiment. It can be understood that in other preferred embodiments, the first edge 203 can be an edge located in a vertical direction of the rectangular pixel unit.

It can be understood that the first strip main electrodes 2021a are parallel to each other in the preferred embodiment. In other preferred embodiments, the first strip main electrodes 2021a are not parallel to each other.

In the preferred embodiment of the present invention, the first strip edge electrode 2021b is additionally disposed in a region of the first edge of the pixel unit, and the first strip edge electrode 2021b is perpendicular to the first edge 203. This can align the liquid crystals definitely (a long axis of the liquid crystal is parallel to the direction of the first edge electrode 2021b). Thus, the dark lines in the edge regions can be effectively suppressed. Simultaneously, a stable dark state area is formed in a horizontally extending region of the first edge electrode 2021b for preventing light leakage due to misalignment between the substrates which are assembled, thereby increasing the transmittance and contrast.

In order to further improve the situation of light leakage or dark lines occurring in the edge region of the pixel unit, referring to FIG. 4, the second strip electrode 2022 of the preferred embodiment comprises a second strip main electrode 2022a which extends to the second edge 204, and a second strip edge electrode 2022b which extends perpendicularly to the second edge 204. An extension initial end of the second strip edge electrode 2022b is connected with an extension terminal end of the second strip edge electrode 2022a.

Preferably, in the preferred embodiment of the present invention, the second strip main electrodes 2022 comprise a third type and a fourth type. Besides, the second strip electrodes 2022 of the third type are the second strip electrodes 2022 extending to a front section of the second edge, and the second strip electrodes 2022 of the fourth type are the second strip electrodes 2022 extending to a rear section of the second edge. In the preferred embodiment of the present invention, the division of the front section and the rear section can be divided according to the midpoint of the second edge.

In the preferred embodiment of the present invention, in order to dispose the second strip electrode 2022 in a limited space as much as possible, the second strip main electrodes 2022a of the third type are mutually parallel, and the second strip main electrodes 2022a of the fourth type are mutually parallel.

To further enhance the quantity of the strip electrodes, referring to FIG. 4, the second strip main electrodes of the third type are mutually parallel to each other. On the basis of the second strip main electrodes of the fourth type mutually parallel to each other, the first strip main electrodes of the first type are mutually parallel to each other, and the first strip main electrodes of the second type are mutually parallel to each other.

Preferably, an angle between the second strip main electrode 2022a and the second strip edge electrode 2022b is between 90 degrees and 140 degrees so as to facilitate the arrangement of liquid crystal molecules.

As shown in FIG. 4, the second edge 204 is an edge located in a horizontal direction of the rectangular pixel unit in the preferred embodiment. In other preferred embodiments, the second edge 204 can be an edge located in a vertical direction of the rectangular pixel unit.

In the preferred embodiment of the present invention, the first strip edge electrode 2021b and the second strip edge electrode 2022b are additionally disposed in a first edge region corresponding to the first edge and a second edge region corresponding to the second edge, simultaneously. This can align the liquid crystals definitely for better controlling the arrangement of liquid crystal molecules. Thus, the dark lines in the edge regions can be effectively suppressed. Simultaneously, a stable dark state area is formed in a horizontally extending region of the edge electrode for preventing light leakage due to misalignment between the substrates which are assembled.

Also, based on the aforementioned, in the preferred embodiment of the present invention, the pixel unit further improves light leakage or dark lines occurring in the edge region of the pixel unit. Refer to FIG. 5, the third strip electrode 2023 of the embodiment comprises a third strip main electrode 2023a extending to the third edge 205, and a third strip edge electrode 2023b which extends perpendicularly to the third edge 205. An extension initial end of the third strip edge electrode 2023b is connected with an extension terminal end of the third strip edge electrode 2023a.

The fourth strip electrode 2024 comprises a fourth strip main electrode 2024a extending to the fourth edge 206, and a fourth strip edge electrode 2024b which extends perpendicularly to the fourth edge 206. An extension initial end of the fourth strip edge electrode 2024b is connected with an extension terminal end of the fourth strip edge electrode 2024a.

Preferably, an angle between the third strip main electrode 2023a and the third strip edge electrode 2023b is between 90 degrees and 140 degrees, and the fourth strip electrode 2024 has similar settings to the third strip electrode 2023.

Preferably, in the preferred embodiment of the present invention, the third strip main electrode 2023a may also include two types of the strip main electrodes. The same types of the third strip main electrodes 2023a are mutually parallel to each other. The fourth strip main electrode 2024a may also include two types of the strip main electrodes. The types of the third strip electrode 2023 and the fourth strip electrode 2024 can be differentiated on the basis of different targets which the strip main electrodes extend to, such as the third strip main electrodes 2023a extending to a front section of the third edge 205 and the third strip main electrodes 2023a extending to a rear section of the third edge 205. The classification of the fourth strip main electrodes 2024a is also similar to the third strip main electrodes 2023a.

Furthermore, one type of the third strip main electrode strip 2023a may be mutually parallel with one type of the fourth strip main electrode strip 2024a for advantageously arranging and controlling the liquid crystal molecules.

Refer to FIG. 5, all of the four edge regions corresponding to the four edges of the pixel unit comprise the strip edge electrode which is perpendicular to the four edges, respectively, such that the liquid crystal molecules are aligned definitely. Thus, this can align the liquid crystal molecules definitely for better controlling the arrangement of liquid crystal molecules in the first edge region and the second edge region. Moreover, the dark lines in the edge regions can be effectively suppressed. Simultaneously, a stable dark state area is formed in a horizontally extending region of the edge electrode for preventing light leakage due to misalignment between the substrates which are assembled.

The present invention has been described with preferred embodiments thereof, and it is understood that many changes and modifications to the described embodiments can be carried out without departing from the scope and the spirit of the invention that is intended to be limited only by the appended claims.

The invention claimed is:

1. A pixel unit for displaying a scene, comprising:
a thin film transistor configured for receiving a scanning signal and a data signal, and for controlling whether to transmit the data signal to a pixel electrode through a drain according to the scanning signal; and
the pixel electrode electrically connected to the drain of the thin film transistor;
the pixel electrode comprising:
a plurality of first strip electrodes extending to a first edge of the pixel unit;
a second strip electrode extending to a second edge of the pixel unit;
a third strip electrode extending to a third edge of the pixel unit;
a fourth strip electrode extending to a fourth edge of the pixel unit;
each of the first strip electrodes comprising:
a first strip main electrode, which extends to the first edge; and
a first strip edge electrode, which extends perpendicularly to the first edge, an extension initial end of the first strip edge electrode being connected with an extension terminal end of the first strip edge electrode;
the second strip electrode comprising:
a second strip main electrode, which extends to the second edge;
a second strip edge electrode, which extends perpendicularly to the second edge, an extension initial end of the second strip edge electrode being connected with an extension terminal end of the second strip edge electrode;
the first strip main electrodes comprise a first type and a second type;
wherein the first strip main electrodes of the first type are mutually parallel, and the first strip main electrodes of the second type are mutually parallel.

2. The pixel unit according to claim 1, wherein the third strip electrode comprises:
a third strip main electrode, which extends to the third edge; and a third strip edge electrode, which extends perpendicularly to the third edge, an extension initial end of the third strip edge electrode being connected with an extension terminal end of the third strip edge electrode.

3. The pixel unit according to claim 2, wherein the fourth strip electrode comprises:
a fourth strip main electrode, which extends to the fourth edge; and
a fourth strip edge electrode, which extends perpendicularly to the fourth edge, an extension initial end of the fourth strip edge electrode being connected with an extension terminal end of the fourth strip edge electrode.

4. The pixel unit display according to claim 2, wherein the pixel electrode comprises a plurality of second strip electrodes;
the second strip main electrodes comprise a third type and a fourth type;
the second strip main electrodes of the third type are mutually parallel;
the second strip main electrodes of the fourth type are mutually parallel.

5. The pixel unit according to claim 4, wherein the first strip main electrode of the first type and the second strip main electrode of the third type are mutually parallel.

6. The pixel unit according to claim 3, wherein the pixel electrode comprises a plurality of second strip electrodes;
the second strip main electrodes comprise a third type and a fourth type;
the second strip main electrodes of the third type are mutually parallel;
the second strip main electrodes of the fourth type are mutually parallel.

7. The pixel unit according to claim 6, wherein the first strip main electrode of the first type and the second strip main electrode of the third type are mutually parallel.

8. The pixel unit according to claim 1, wherein an angle between the first strip main electrode and the first strip edge electrode is between 90 degrees and 140 degrees.

9. The pixel unit according to claim 8, wherein an angle between the second strip main electrode and the second strip edge electrode is between 90 degrees and 140 degrees.

10. A pixel unit for displaying a scene, comprising:
a thin film transistor configured for receiving a scanning signal and a data signal, and for controlling whether to transmit the data signal to a pixel electrode through a drain according to the scanning signal;
the pixel electrode electrically connected to the drain of the thin film transistor;
the pixel electrode comprising:
a plurality of first strip electrodes extending to a first edge of the pixel unit;
a second strip electrode extending to a second edge of the pixel unit;
a third strip electrode extending to a third edge of the pixel unit;
a fourth strip electrode extending to a fourth edge of the pixel unit;
each of the first strip electrodes comprising:
a first strip main electrode, which extends to the first edge; and
a first strip edge electrode, which extends perpendicularly to the first edge, an extension initial end of the first strip edge electrode being connected with an extension terminal end of the first strip edge electrode.

11. The pixel unit according to claim 10, wherein the second strip electrode comprises:
a second strip main electrode, which extends to the second edge;
a second strip edge electrode, which extends perpendicularly to the second edge, an extension initial end of the second strip edge electrode being connected with an extension terminal end of the second strip edge electrode.

12. The pixel unit according to claim 11, wherein the third strip electrode comprises:
a third strip main electrode, which extends to the third edge; and
a third strip edge electrode, which extends perpendicularly to the third edge, an extension initial end of the third strip edge electrode being connected with an extension terminal end of the third strip edge electrode.

13. The pixel unit according to claim 12, wherein the fourth strip electrode comprises:
a fourth strip main electrode, which extends to the fourth edge; and
a fourth strip edge electrode, which extends perpendicularly to the fourth edge, an extension initial end of the fourth strip edge electrode being connected with an extension terminal end of the fourth strip edge electrode.

14. The pixel unit according to claim 10, wherein the pixel electrode comprises a plurality of first strip electrodes;
the first strip main electrodes comprise a first type and a second type;
the first strip main electrodes of the first type are mutually parallel, and the first strip main electrodes of the second type are mutually parallel.

15. The pixel unit according to claim 11, wherein the pixel electrode comprises a plurality of second strip electrodes;
the second strip main electrodes comprise a third type and a fourth type;
the second strip main electrodes of the third type are mutually parallel;
the second strip main electrodes of the fourth type are mutually parallel.

16. The pixel unit according to claim 15, wherein the first strip main electrodes comprise a first type and a second type;
the first strip main electrodes of the first type are mutually parallel;
the first strip main electrodes of the second type are mutually parallel.

17. The pixel unit according to claim 16, wherein the first strip main electrode of the first type and the second strip main electrode of the third type are mutually parallel.

18. The pixel unit according to claim 10, wherein an angle between the first strip main electrode and the first strip edge electrode is between 90 degrees and 140 degrees.

19. The pixel unit according to claim 10, wherein the pixel unit is a rectangular pixel unit.

20. The pixel unit according to claim 11, wherein an angle between the first strip main electrode and the first strip edge electrode is between 90 degrees and 140 degrees.

* * * * *